(12) United States Patent
Li et al.

(10) Patent No.: US 12,347,464 B2
(45) Date of Patent: Jul. 1, 2025

(54) HARD DRIVE BACKPLANE ASSEMBLY AND ELECTRONIC DEVICE

(71) Applicant: Huawei Technologies Co., Ltd., Shenzhen (CN)

(72) Inventors: Rong Li, Shenzhen (CN); Liangyun Wang, Dongguan (CN); Min Wei, Vienna (AT); Guanglin Lin, Dongguan (CN)

(73) Assignee: HUAWEI TECHNOLOIGES CO., LTD., Shenzhen (CN)

( * ) Notice: Subject to any disclaimer, the term of this patent is extended or adjusted under 35 U.S.C. 154(b) by 229 days.

(21) Appl. No.: 18/327,377

(22) Filed: Jun. 1, 2023

(65) Prior Publication Data

US 2023/0307009 A1    Sep. 28, 2023

Related U.S. Application Data

(63) Continuation of application No. PCT/CN2021/134769, filed on Dec. 1, 2021.

(30) Foreign Application Priority Data

Dec. 1, 2020  (CN) .......................... 202011385698.5

(51) Int. Cl.
*H05K 5/00*    (2025.01)
*G06F 1/16*    (2006.01)
(Continued)

(52) U.S. Cl.
CPC ............ *G11B 33/126* (2013.01); *G11B 33/08* (2013.01); *G11B 33/142* (2013.01)

(58) Field of Classification Search
CPC ..... G11B 33/126; G11B 33/08; G11B 33/142; G06F 1/18; G06F 1/181; G06F 1/1684; G06F 1/1656; G06F 1/1658
See application file for complete search history.

(56) References Cited

U.S. PATENT DOCUMENTS 5,680,295 A * 10/1997 Le .............................. G06F 1/20
                                                        361/679.48
6,424,523 B1 * 7/2002 Curtis .................. G11B 33/126
(Continued)

FOREIGN PATENT DOCUMENTS

CN     206419135 U    8/2017
CN     107727376 A    2/2018
(Continued)

OTHER PUBLICATIONS

Bai Yun et al., Analysis of Reactive Muffler Performance Based on GT-Power, 10.16638/j.cnki.1671-7988.2015.11.022, Nov. 26, 2015, with an English abstract total 3 pages.

*Primary Examiner* — Anthony M Haughton
(74) *Attorney, Agent, or Firm* — Conley Rose, P.C.

(57) ABSTRACT

A hard drive backplane has a plurality of ventilation holes, and the expansion cavity muffler is mounted in the ventilation holes of the hard drive backplane. The expansion cavity muffler includes at least one expansion cavity and at least one connecting pipe in communication in a first direction. The connecting pipe at one end of the expansion cavity muffler facing toward the hard drive backplane is fixedly mounted in the ventilation hole such that the expansion cavity muffler is in communication with the ventilation hole. An area of a cross-section that is of each expansion cavity and that is perpendicular to the first direction is larger than an area of a cross-section that is of the connecting pipe adjacent to the expansion cavity and that is perpendicular to the first direction. The first direction is perpendicular to a surface of the hard drive backplane.

20 Claims, 7 Drawing Sheets

(51) Int. Cl.
*G11B 33/08* (2006.01)
*G11B 33/12* (2006.01)
*G11B 33/14* (2006.01)
*H05K 7/00* (2006.01)

(56) References Cited

U.S. PATENT DOCUMENTS

| | | | |
|---|---|---|---|
| 8,275,266 B2* | 9/2012 | Tan | H04B 10/803 |
| | | | 398/118 |
| 10,037,782 B1* | 7/2018 | Killen, Jr. | G06F 12/0623 |
| 10,133,321 B1 | 11/2018 | Bhopte et al. | |
| 2006/0171119 A1* | 8/2006 | Baldwin, Jr. | H05K 7/20672 |
| | | | 361/700 |
| 2008/0065245 A1* | 3/2008 | Tang | H05K 7/20727 |
| | | | 700/94 |
| 2015/0195942 A1* | 7/2015 | Rossman | H05K 7/1451 |
| | | | 403/376 |
| 2018/0247677 A1 | 8/2018 | Eguchi et al. | |
| 2021/0287720 A1* | 9/2021 | Wang | H05K 7/1462 |
| 2021/0405435 A1* | 12/2021 | Xiao | G02F 1/133385 |
| 2023/0307009 A1* | 9/2023 | Li | G06F 1/206 |

FOREIGN PATENT DOCUMENTS

| | | |
|---|---|---|
| CN | 207145343 U | 3/2018 |
| CN | 108533531 A | 9/2018 |
| CN | 208763950 U | 4/2019 |
| JP | H1166832 A | 3/1999 |

* cited by examiner

HARD DRIVE BACKPLANE ASSEMBLY AND ELECTRONIC DEVICE

CROSS-REFERENCE TO RELATED APPLICATIONS

This is a continuation of International Patent Application No. PCT/CN2021/134769 filed on Dec. 1, 2021, which claims priority to Chinese Patent Application No. 202011385698.5 filed on Dec. 1, 2020. The disclosures of the aforementioned applications are hereby incorporated by reference in their entireties.

TECHNICAL FIELD

This application relates to the field of server technologies, and in particular, to a hard drive backplane assembly and an electronic device.

BACKGROUND

Compared with solid-state drives, hard disk drives are superior in capacity and price. However, the evolution of hard disk drives is limited by the thickness of hard drives. The capacity of a hard drive cannot be increased by increasing the number of platters. Instead, the capacity of a hard drive is increased only by reducing the track density and increasing the amount of data stored on a single track. Therefore, in a read/write process of a large-capacity hard drive, a high-tracking precision of a magnetic head and a small run out amplitude of the magnetic head are required. If a magnetic head has an excessively large deviation during track seeking in a hard drive, a signal indicating an unsuccessful read/write is fed back. In this case, attempts are made to position the magnetic head again until the track seeking is successful and a read/write operation is completed. When a read/write performed by the magnetic head fails and multiple times of track seeking are required, input/output operations per second (IOPS) performance is degraded. The hard drive may vibrate during operation. When a vibration frequency of an actuator arm or a magnetic head is close to a natural frequency of the actuator arm or the magnetic head of the hard drive, the actuator arm and the magnetic head resonate, resulting in a larger magnetic head track error signal and a significant degrade in the IOPS performance. If the IOPS decreases to 0 for a period of time, the system removes the hard drive to prevent physical damage to the hard drive.

With the evolution of central processing units (CPUs), power consumption of CPUs increases, and higher requirements are posed on heat dissipation. A higher rotational speed of a cooling fan indicates higher noise. The noise travels through air to a housing of the hard drive, causing the actuator arm and magnetic heads in the hard drive to vibrate, and resulting in a decrease in the IOPS. In recent years, fan noise has become a major factor affecting the performance of hard disk drives. Especially in high-density storage, fan noise reduction and improvement of an anti-noise capability of hard disk drives become particularly important.

SUMMARY

This application provides a hard drive backplane assembly and an electronic device, to reduce impact of fan noise on a hard drive, reduce vibration of the hard drive, and increase input/output operations per second of the hard drive.

According to a first aspect, this application provides a hard drive backplane assembly. The hard drive backplane assembly includes a hard drive backplane and an expansion cavity muffler. The hard drive backplane has a plurality of ventilation holes configured to allow an airflow from a cooling fan to circulate. The expansion cavity muffler is mounted in the ventilation holes of the hard drive backplane. The expansion cavity muffler includes at least one expansion cavity and at least one connecting pipe in communication in a first direction to form an expansion cavity muffler that can reduce noise. The connecting pipe at one end of the expansion cavity muffler facing toward the hard drive backplane is fixedly mounted in the ventilation hole, and the expansion cavity muffler is in communication with the ventilation holes, so that airflow can flow through the expansion cavity muffler and the ventilation holes. An area of a cross-section that is of each expansion cavity and that is perpendicular to the first direction is larger than an area of a cross-section that is of the connecting pipe adjacent to the expansion cavity and that is perpendicular to the first direction. The first direction is perpendicular to a surface of the hard drive backplane. In this solution, the expansion cavity muffler can reduce the impact of the noise generated by the cooling fan on the hard drive, to reduce vibration of the hard drive and increase input/output operations per second of the hard drive. In addition, the airflow can flow through the expansion cavity muffler, to ensure the heat dissipation effect of the cooling fan.

In a specific embodiment, a specific structure of the expansion cavity muffler is not limited. For example, the expansion cavity muffler with a simple structure may include one expansion cavity and two connecting pipes, and the two connecting pipes are respectively in communication with two ends of the expansion cavity; or the expansion cavity muffler includes one expansion cavity and one connecting pipe in communication with each other. In this solution, the expansion cavity muffler is simple, and requires a simple preparation process and low costs. In addition, a volume of the expansion cavity muffler can be reduced, thereby reducing occupation of space on the hard drive backplane by the expansion cavity muffler.

In addition, the expansion cavity muffler may also include at least two expansion cavities, and every adjacent two expansion cavities are in communication with each other through the connecting pipe. A larger quantity of expansion cavities and connecting pipes included in the expansion cavity muffler indicates a better noise reduction effect of the expansion cavity muffler.

In a specific configuration of the expansion cavity muffler, the connecting pipe may extend into the adjacent expansion cavities by a specified distance. In this solution, the expansion cavity muffler can achieve a large noise reduction for noise of each frequency. This helps improve the noise reduction effect of the expansion cavity muffler.

A ventilation cavity is provided inside the expansion cavity muffler, and a vertical projection of the ventilation cavity of the expansion cavity muffler on the surface of the hard drive backplane completely covers the ventilation hole. In this solution, the expansion cavity muffler does not block the airflow from the cooling fan, so that a flow volume of the airflow can be ensured, thereby ensuring the heat dissipation effect of the cooling fan.

In addition, a sound-absorbing layer may be disposed on an inner surface of the expansion cavity muffler, to improve the noise reduction effect of the expansion cavity muffler and further reduce noise transmitted through the expansion cavity muffler, thereby providing a better protection effect for the hard drive.

A sound-absorbing layer may also be disposed on an outer surface of the expansion cavity muffler, so that noise transmitted through an area of the hard drive backplane having no ventilation hole can be reduced, thereby providing a better protection effect for the hard drive.

A manner of mounting the expansion cavity muffler on the hard drive backplane is not limited. For example, the expansion cavity muffler may be snap-fit to the hard drive backplane. This requires a simple mounting process, and no structure matching the expansion cavity muffler needs to be fabricated on the hard drive backplane. In addition, the expansion cavity muffler may alternatively be connected to the hard drive backplane by adhesion or a screw.

A material of the expansion cavity muffler may be plastic or metal. This is not limited in this application. In addition, the expansion cavity muffler may be an integrally formed structure. For example, the expansion cavity muffler is made of a plastic material, and the expansion cavity muffler may be prepared by an injection molding process.

A shape of a cross-section of the expansion cavity perpendicular to the first direction is not limited. Specifically, the shape of the cross-section of the expansion cavity perpendicular to the first direction, a shape of a cross-section of the connecting pipe perpendicular to the first direction, and a shape of the ventilation hole may be identical or different. Specifically, the shape of the cross-section of the expansion cavity perpendicular to the first direction and the shape of the cross-section of the connecting pipe perpendicular to the first direction are identical to the shape of the ventilation hole. This can reduce wind resistance generated by the expansion cavity muffler.

According to a second aspect, this application further provides an electronic device. The electronic device includes the hard drive backplane assembly according to any one of the foregoing technical solutions, and further includes a hard drive and a cooling fan. The hard drive and the cooling fan are located on two sides of the hard drive backplane assembly, and the cooling fan is located on the side of the hard drive backplane assembly having the expansion cavity muffler. Therefore, in this solution, noise generated by the cooling fan can be reduced by the expansion cavity muffler, thereby reducing impact on vibration of the hard drive. In addition, the expansion cavity muffler has little impact on an airflow from the cooling fan, thereby ensuring a heat dissipation effect of the electronic device.

REFERENCE NUMERALS

100—frame;
200—cooling fan;
300—hard drive;
400—hard drive backplane assembly;
410—hard drive backplane;
411—ventilation hole;
420—expansion cavity muffler;
421—expansion cavity;
422—connecting pipe;
423—hook portion;
500—electronic component.

DESCRIPTION OF EMBODIMENTS

Terms used in the following embodiments are merely intended to describe specific embodiments, and are not intended to limit this application. As used in the specification and the appended claims of this application, the singular expressions "a/an", "one", "said", "the above", "the" and "this" are intended to also include such expressions as "one or more", unless otherwise clearly indicated in the context.

Reference to "an embodiment" or "a specific embodiment" or the like described in the specification means that one or more embodiments of this application include a specific feature, structure, or characteristic described with reference to this embodiment. The terms "include", "comprise", "have", and variations thereof all mean "including, but not limited to", unless otherwise particularly specified.

To facilitate understanding of a hard drive backplane assembly and an electronic device provided in embodiments of this application, the following first describes an application scenario of the hard drive backplane assembly and the electronic device. For electronic devices having a hard drive, as performance of the electronic devices gradually increase, the capacity of hard drives gradually increases, and heat dissipation requirements also gradually increase. However, a higher rotational speed of a cooling fan indicates higher noise generated, and a higher probability of vibration of the hard drive. Hard drive vibration is likely to reduce IOPS of a large-capacity hard drive, resulting in degraded performance of the electronic device. In conventional technologies, impact of the noise of the cooling fan on the vibration of the hard drive is reduced by regulating an airflow from the fan, preventing backflow, and reducing wind resistance. However, in practice, regulating the airflow from the fan, preventing backflow, and reducing wind resistance can achieve a limited noise reduction effect, especially for systems originally having a smooth flow field. Specifically, a waveguide board may be used to regulate the airflow, and sound-absorbing cotton may be used to absorb noise. However, such structures affect the air intake volume, resulting in poor heat dissipation and increased CPU temperature. Therefore, this application provides a hard drive backplane assembly and an electronic device, to reduce impact of noise of a cooling fan on a hard drive while ensuring a good heat dissipation effect, thereby improving IOPS of the hard drive. The electronic device in embodiments of the present disclosure may be a storage system, a server, or the like. The following uses specific embodiments to describe technical solutions of this application with reference to the accompanying drawings.

Figure 1:
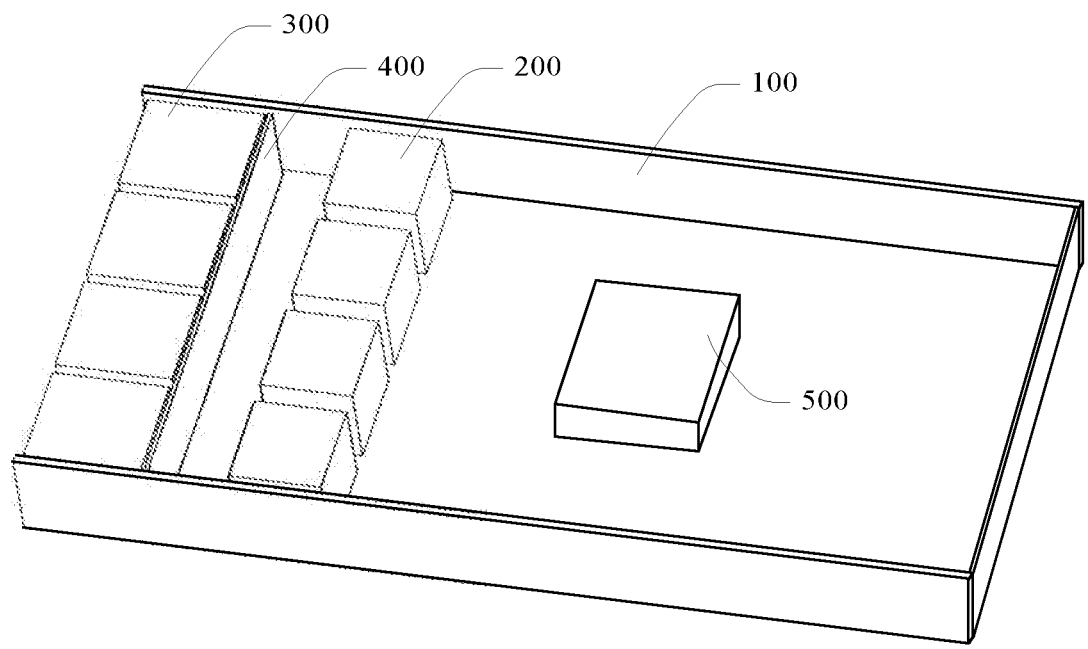
FIG. 1 is a partial schematic structural diagram of an electronic device according to an embodiment of this application.
Figure 2:
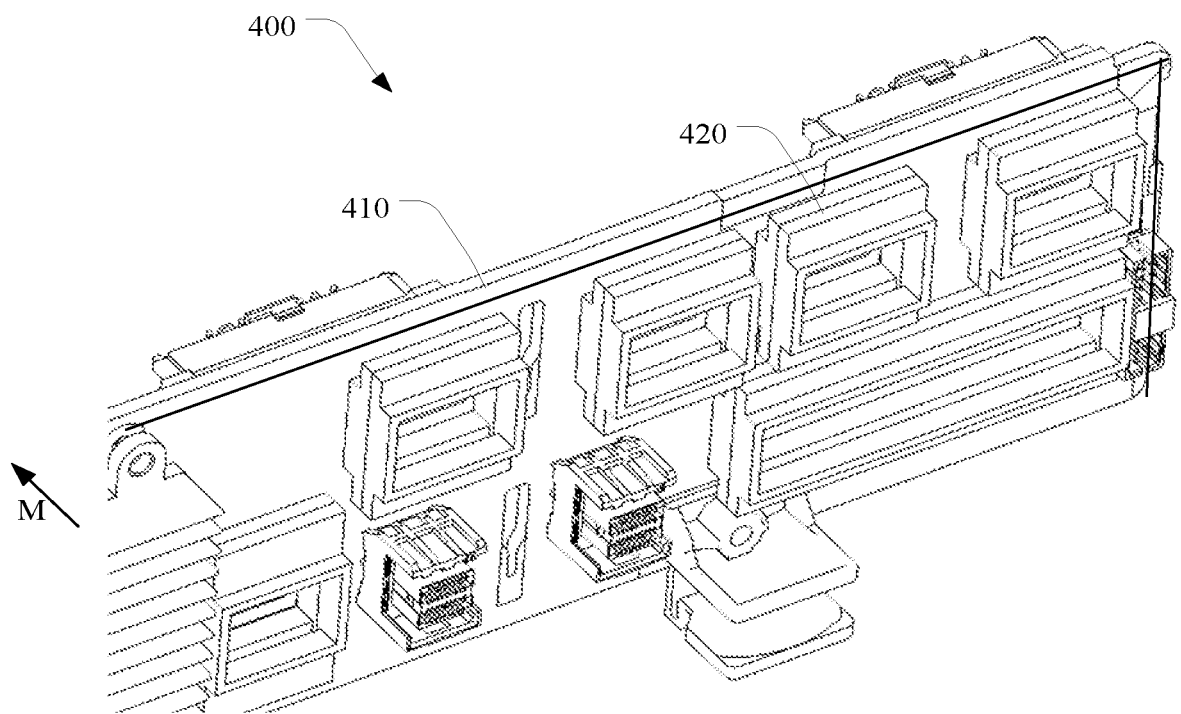
FIG. 2 is a partial schematic structural diagram of a hard drive backplane assembly according to an embodiment of this application.
Figure 3:
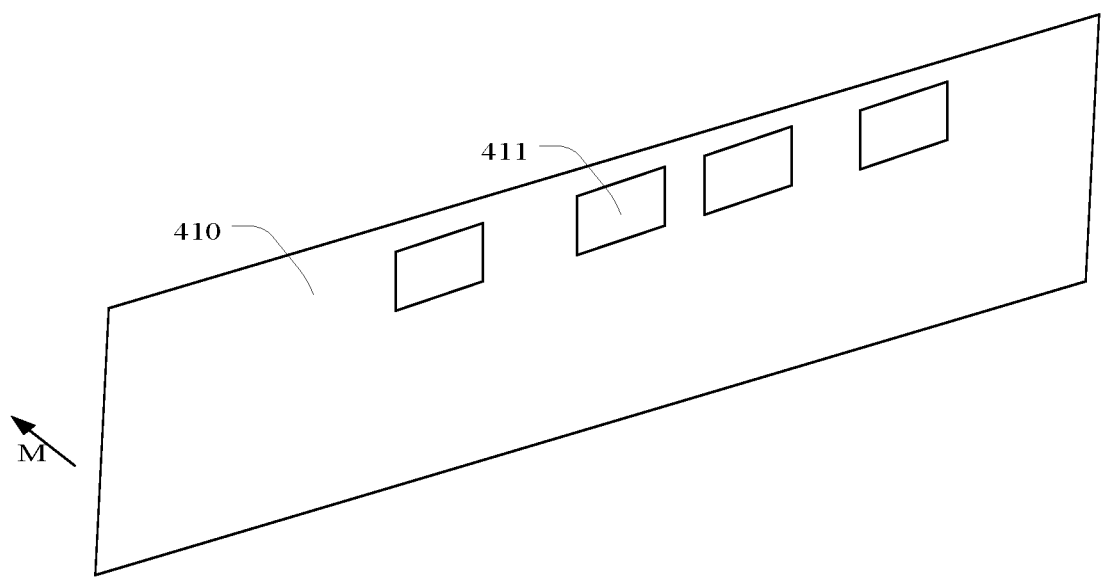
FIG. 3 is a schematic structural diagram of a hard drive backplane according to an embodiment of this application.

FIG. 1 is a partial schematic structural diagram of an electronic device according to an embodiment of this application. FIG. 2 is a partial schematic structural diagram of a hard drive backplane assembly according to an embodiment of this application. FIG. 3 is a schematic structural diagram of a hard drive backplane according to an embodiment of this application.

As shown in FIG. 1 and FIG. 2, the electronic device may be specifically a server. The server includes a frame 100, and a cooling fan 200, a hard drive 300, and an electronic component 500 such as a CPU that are disposed in the frame 100, and further includes a hard drive backplane assembly 400. The hard drive 300 is mounted on the hard drive backplane assembly 400. The hard drive backplane assembly 400 includes a hard drive backplane 410 and an expansion cavity muffler 420. The cooling fan 200 and the hard drive 300 are located on two sides of the hard drive backplane assembly 400. The cooling fan 200 is disposed on the side of the hard drive backplane assembly 400 on which the expansion cavity muffler 420 is disposed. The hard drive 300 is disposed on the side of the hard drive backplane 410 that faces away from the expansion cavity muffler 420. As shown in FIG. 3, the hard drive backplane 410 includes ventilation holes 411, so that an airflow generated by the cooling fan 200 may circulate through the ventilation holes 411.

Figure 4:
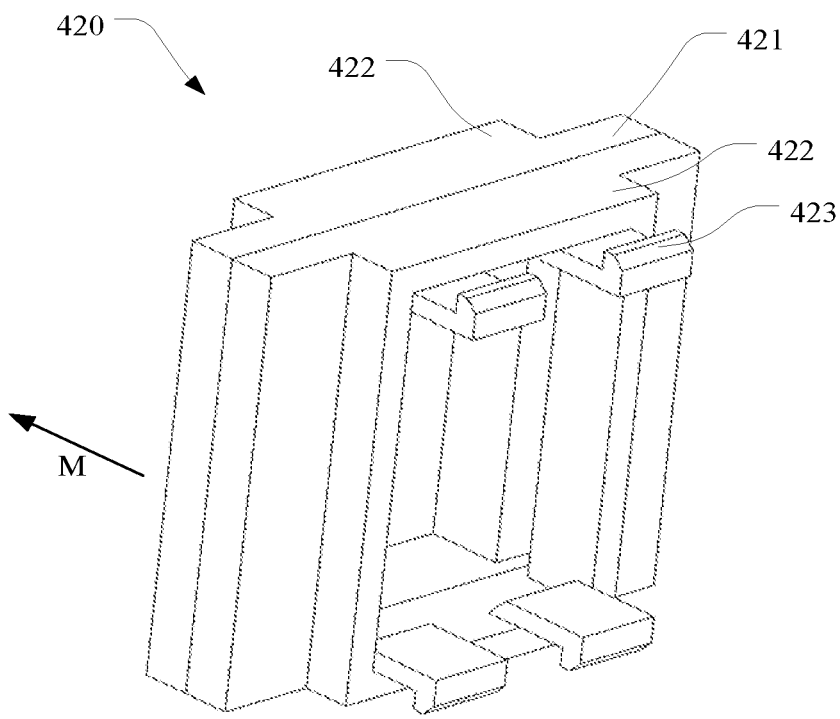
FIG. 4 is a schematic three-dimensional structural diagram of an expansion cavity muffler according to an embodiment of this application.
Figure 5:
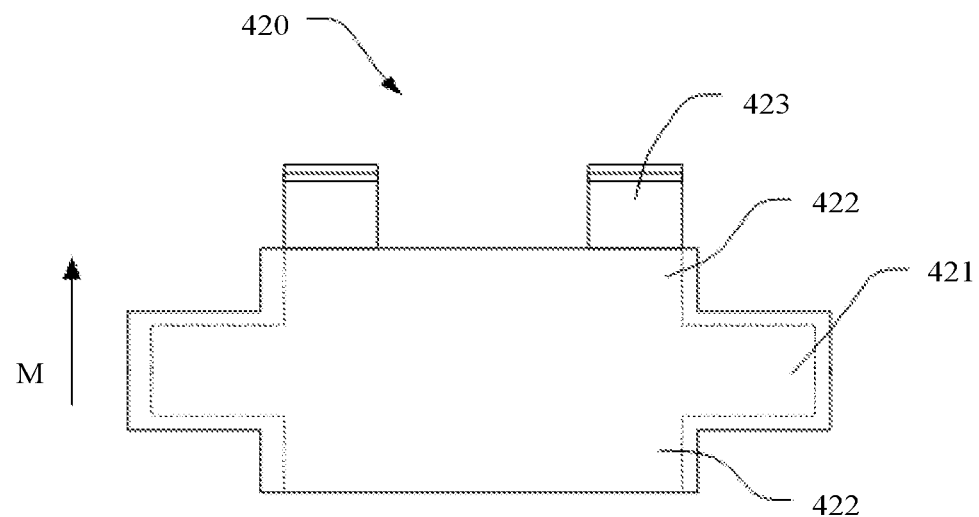
FIG. 5 is a schematic cross-sectional structural diagram of an expansion cavity muffler according to an embodiment of this application.

FIG. 4 is a schematic three-dimensional structural diagram of an expansion cavity muffler according to an embodiment of this application. FIG. 5 is a schematic cross-sectional structural diagram of an expansion cavity muffler according to an embodiment of this application. With reference to FIG. 3 to FIG. 5, the expansion cavity muffler 420 includes at least one expansion cavity 421 and at least one connecting pipe 422, and the expansion cavity 421 and the connecting pipe 422 are disposed in communication with each other in a first direction M. The expansion cavity muffler 420 faces toward the connecting pipe 422 of the hard drive backplane 410, and is fixedly connected to the ventilation holes 411 of the hard drive backplane 410. The first direction M is perpendicular to a surface of the hard drive backplane 410. Therefore, the expansion cavity muffler 420 is directly in communication with the ventilation holes 411, and generates small wind resistance, and the airflow generated by the fan may flow directly through the expansion cavity muffler 420 and the ventilation holes 411. Therefore, this solution has little impact on a heat dissipation effect of the electronic device, and the electronic device can have a good heat dissipation effect. In addition, an area of a cross-section of the expansion cavity 421 perpendicular to the first direction M is larger than an area of a cross-section of the connecting pipe 422 adjacent to the expansion cavity 421 perpendicular to the first direction M such that noise transmitted through the expansion cavity muffler 420 can be reduced. This solution can greatly reduce the noise transmitted through the expansion cavity muffler 420, and therefore reduce vibration caused by the noise, so that the hard drive 300 suffers less vibration interference, thereby improving IOPS of the hard drive 300. Therefore, this solution reduces impact of noise of the cooling fan 200 on the hard drive 300 while ensuring a good heat dissipation effect of the electronic device.

The expansion cavity muffler 420 is a structural form of a resistive muffler. Pipes and cavities of different shapes are properly combined to achieve an impedance mismatch of the pipe system to reflect or interfere with a sound wave, thereby reducing acoustic energy radiated outward through the expansion cavity muffler 420. A solid part of the hard drive backplane 410 has a good sound insulation effect, but a sound wave may directly pass through the ventilation holes 411. In this application, the expansion cavity muffler 420 mounted on the ventilation holes reduces noise transmitted to the hard drive 300, and has little impact on ventilation. It should be noted that a tight connection between the expansion cavity 421 and the connecting pipe 422 adjacent to each other should not lead to air leakage.

In addition, to reduce impact of the expansion cavity muffler 420 on the ventilation through the ventilation holes 411, a ventilation cavity inside the expansion cavity muffler 420 may further completely cover the ventilation hole 411 of the hard drive backplane 410. To be specific, a vertical projection of the ventilation cavity of the expansion cavity muffler 420 on the hard drive backplane 410 completely covers the ventilation hole 411. In other words, an area of a vertical projection of the ventilation cavity of the expansion cavity muffler 420 on the hard drive backplane 410 at any position is greater than or equal to the area of the ventilation hole 411. In addition, the ventilation cavity faces toward the ventilation hole 411. Therefore, the expansion cavity muffler 420 does not block the ventilation hole 411 at any position, thereby sufficiently ensuring the ventilation through the ventilation hole 411 and ensuring a heat dissipation effect of the cooling fan 200.

Figure 6:
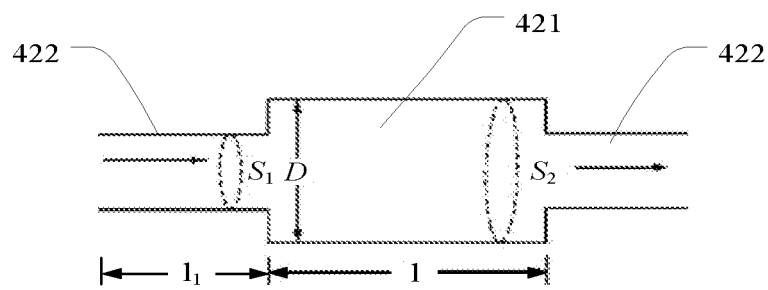
FIG. 6 is a schematic diagram of a model of an expansion cavity muffler according to an embodiment of this application.

FIG. 6 is a schematic diagram of a model of an expansion cavity muffler according to an embodiment of this application. With reference to FIG. 6, a noise reduction of the expansion cavity muffler 420 meets:

$$L_R = 10 lg\left[1 + \frac{1}{4}\left(m - \frac{1}{m}\right)^2 \sin^2 kl\right]$$

where m represents an expansion ratio, $m=S_2/S_1$, $S_2$ represents a cross-sectional area of the expansion cavity, $S_1$ represents a cross-sectional area of the connecting pipe 422, k represents a wave number, $k=2\pi f/c$, f represents a frequency of a sound wave, c represents sound velocity, and l represents a length of the expansion cavity. It can be learned that the noise reduction of the expansion cavity muffler 420 periodically changes with respect to the frequency of the sound wave, and a larger expansion ratio indicates a larger noise reduction.

Based on the foregoing formula, a frequency corresponding to a maximum noise reduction, a frequency corresponding to a minimum noise reduction, and a cut-off frequency may be obtained. Therefore, dimensions of the expansion cavity muffler 420 may be calculated based on a frequency of noise to be reduced.

The frequency corresponding to the maximum noise reduction is:

$$f_{max} = (2n+1)\frac{c}{4l} \quad n = 0, 1, 2, \ldots$$

The frequency corresponding to the maximum noise reduction, that is, the frequency corresponding to $L_R=0$, is:

$$f_{min} = \frac{n}{2l}c \quad n = 0, 1, 2, \ldots$$

The cut-off frequency is:

$$f_{upper} = 1.22\frac{c}{D}$$

$$fl_{ower} = \frac{c}{\sqrt{2\pi}} * \sqrt{\frac{S_1}{Vl_1}}$$

where V represents a volume of the expansion cavity, $l_1$ represents a length of the connecting pipe 422, and D represents an equivalent diameter of the expansion cavity.

In a specific embodiment, a specific structure of the expansion cavity muffler 420 is not limited. For example, as shown in FIG. 4 and FIG. 5, the expansion cavity muffler 420 includes one expansion cavity 421 and two connecting pipes 422 disposed in communication with each other in the first direction M, and the two connecting pipes 422 are respectively located at two ends of the expansion cavity 421. One connecting pipe 422 is connected to the hard drive backplane 410, and the other connecting pipe 422 faces toward the cooling fan 200. In this solution, the expansion cavity muffler 420 has a simple structure, is convenient to fabricate, and occupies small space. Further, a height of the expansion cavity muffler 420 may be made not greater than a height of any other component on the hard drive backplane 410 such as not to occupy wiring space. This helps improve integration of the electronic device.

Figure 7:
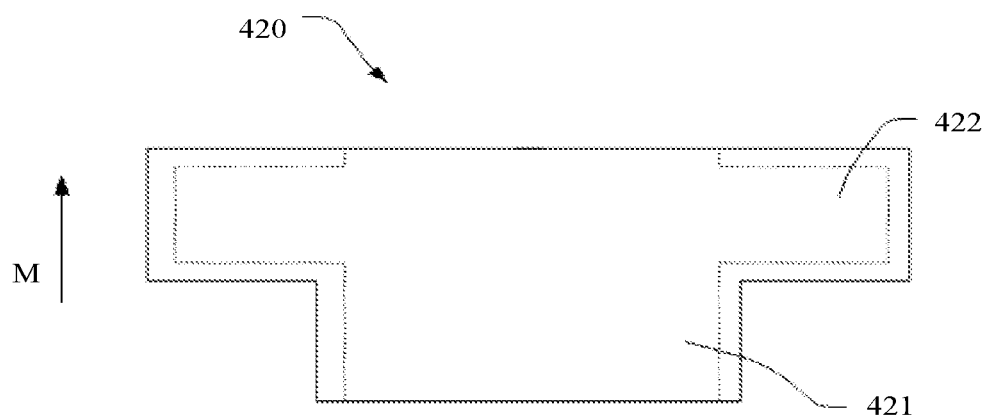
FIG. 7 is another schematic cross-sectional structural diagram of an expansion cavity muffler according to an embodiment of this application.

FIG. 7 is another schematic structural diagram of an expansion cavity muffler according to an embodiment of this application. As shown in FIG. 7, the expansion cavity muffler 420 may alternatively include only one expansion cavity and one connecting pipe 422. This solution can further simplify the structure of the expansion cavity muffler 420 and reduce the space occupied by the expansion cavity muffler 420.

Figure 8:
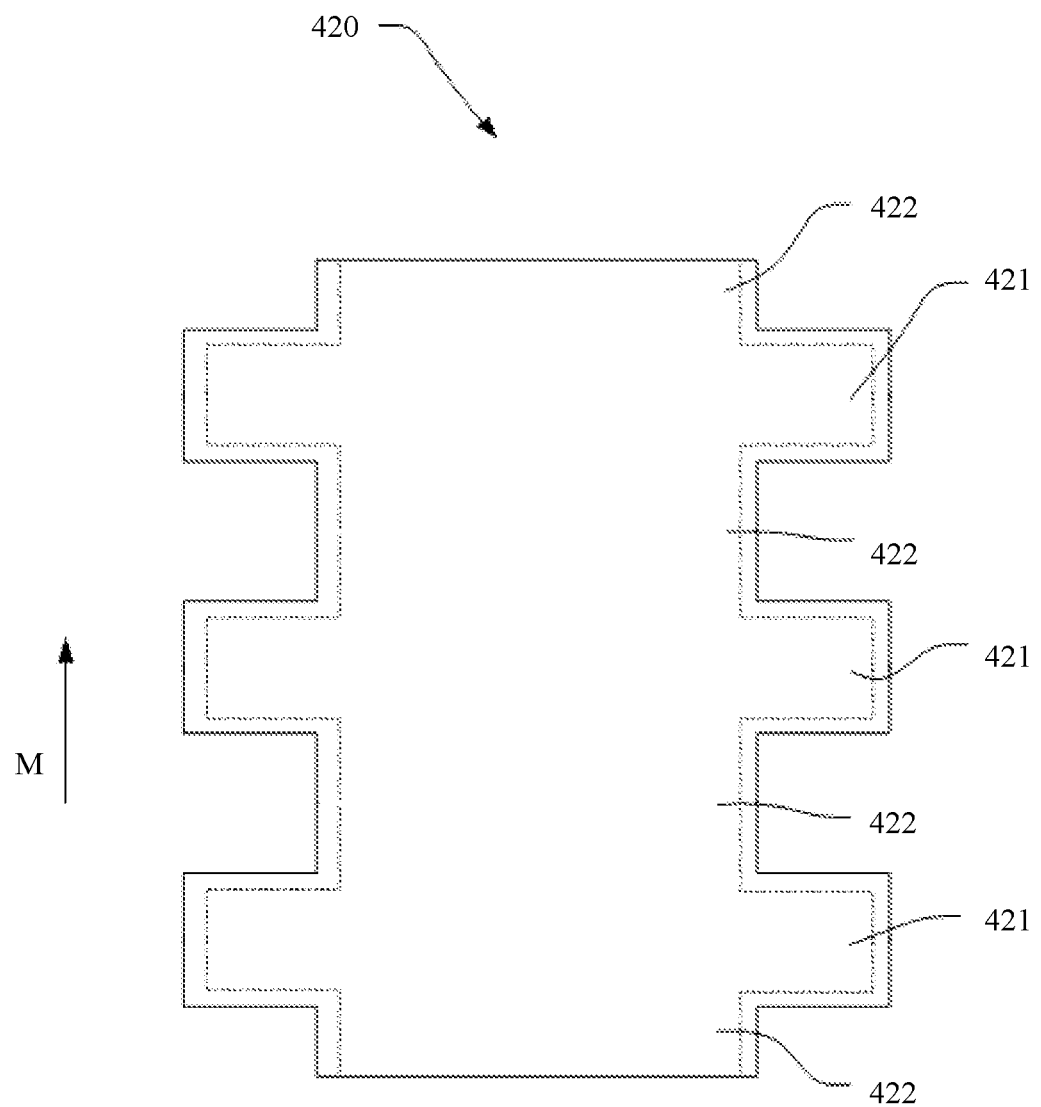
FIG. 8 is another schematic cross-sectional structural diagram of an expansion cavity muffler according to an embodiment of this application.

FIG. 8 is another schematic structural diagram of an expansion cavity muffler according to an embodiment of this application. As shown in FIG. 8, the expansion cavity muffler 420 includes at least two expansion cavities 421 disposed in communication with each other in the first direction M, and every two adjacent expansion cavities 421 are in communication with each other through the connecting pipe 422. In other words, the expansion cavities 421 and the connecting pipes 422 are sequentially connected in an alternate manner. In this solution, the expansion cavities 421 are connected in series, so that a multi-stage noise reduction effect can be achieved. Through the proper design of the expansion cavities 421 and the connecting pipes 422, noise of multiple frequencies can be reduced, thereby providing a good noise reduction effect. It is found by comparing and testing an electronic device equipped with the expansion cavity muffler 420 and an electronic device not equipped with the expansion cavity muffler 420 that the expansion cavity muffler 420 in this technical solution of this application can reduce noise in a frequency band of 2 kilohertz (kHz) to 10 kHz by 3.5 decibels (dB), and improve IOPS performance of the hard drive 300 by up to 10%.

Figure 9:
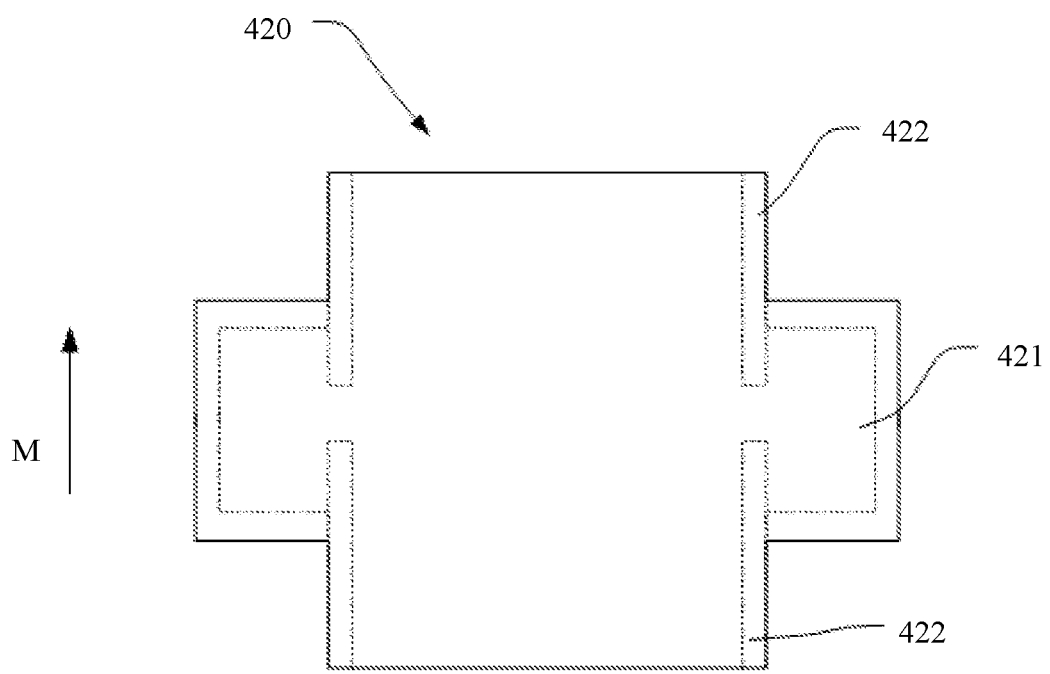
FIG. 9 is another schematic cross-sectional structural diagram of an expansion cavity muffler according to an embodiment of this application.
Figure 10:
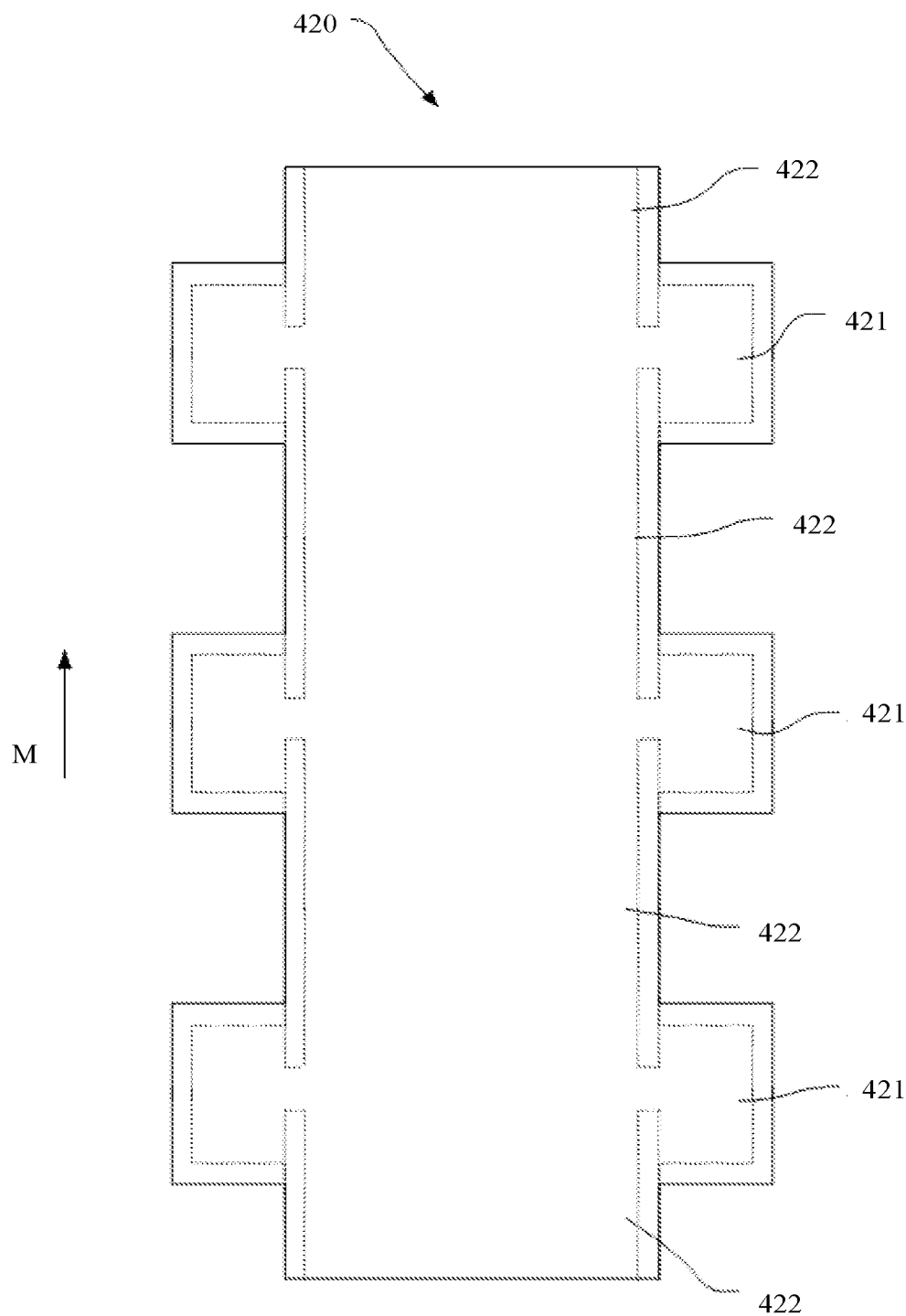
FIG. 10 is another schematic cross-sectional structural diagram of an expansion cavity muffler according to an embodiment of this application.
Figure 11:
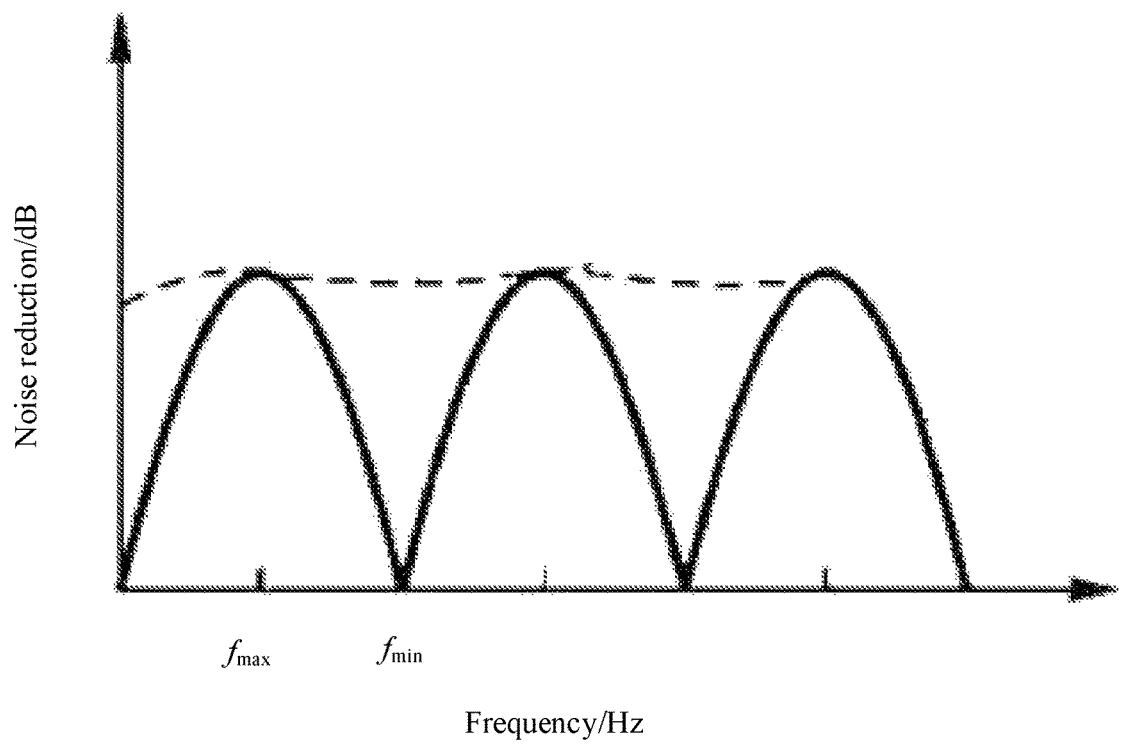
FIG. 11 is a schematic diagram of a relationship between a noise reduction and a noise frequency according to an embodiment of this application.

In another embodiment, FIG. 9 to FIG. 10 are other schematic structural diagrams of an expansion cavity muffler according to an embodiment of this application. As shown in FIG. 9 to FIG. 10, the connecting pipe 422 extends into the expansion cavity 421 by a specified distance. In this solution, because the connecting pipe 422 extends into the expansion cavity 421 by the specified distance, the expansion cavity muffler 420 can achieve a large noise reduction for noise of each frequency. This helps improve a noise reduction effect of the expansion cavity muffler 420. FIG. 11 is a schematic diagram of a relationship between a noise reduction and a noise frequency according to an embodiment of this application. As shown in FIG. 11, a solid line in the figure represents a curve of a relationship between a noise frequency and a noise reduction of the expansion cavity muffler 420 when the connecting pipe 422 does not extend into the expansion cavity 421, and a dashed line in the figure represents a curve of a relationship between a noise frequency and a noise reduction of the expansion cavity muffler 420 when the connecting pipe 422 extends into the expansion cavity 421. It can be learned that when the connecting pipe 422 extends into the expansion cavity 421 by the specified distance, the expansion cavity muffler 420 achieves a large noise reduction for noise of all frequencies. Therefore, this solution has a good noise reduction effect for noise of all the frequencies.

For example, in the expansion cavity muffler 420 shown in FIG. 9, one expansion cavity 421 is in communication with two connecting pipes 422, and both the two connecting pipes 422 extend into the expansion cavity 421 by the specified distance. It is found by comparing and testing an electronic device equipped with the expansion cavity muffler 420 and an electronic device not equipped with the expansion cavity muffler 420 that the expansion cavity muffler 420 in this technical solution can reduce noise in a frequency band of 2 kHz to 10 kHz by 2.1 dB, and improve IOPS performance of the hard drive 300 by up to 5.7%.

In the foregoing embodiments, when two sides of the same expansion cavity 421 are each connected to a connecting pipe 422, the connecting pipes 422 on the two sides may extend into the expansion cavity 421 by the same or different specified distances. This may be designed according to an actual requirement.

To improve the noise reduction effect of the expansion cavity muffler 420, a sound-absorbing layer may be further disposed on an inner surface of the expansion cavity muffler 420, so that noise passing through the expansion cavity muffler 420 can be further reduced, thereby reducing impact of the noise on the hard drive 300.

In addition, a sound-absorbing layer may also be disposed on an outer surface of the expansion cavity muffler 420, so that noise outside the expansion cavity muffler 420 can also be reduced. This can also reduce overall impact of noise on the hard drive 300.

Specifically, when the expansion cavity muffler 420 is mounted on the hard drive backplane 410, as shown in FIG. 4, the expansion cavity muffler 420 may have a hook portion 423, and the hook portion 423 matches the ventilation hole

Figure 12:
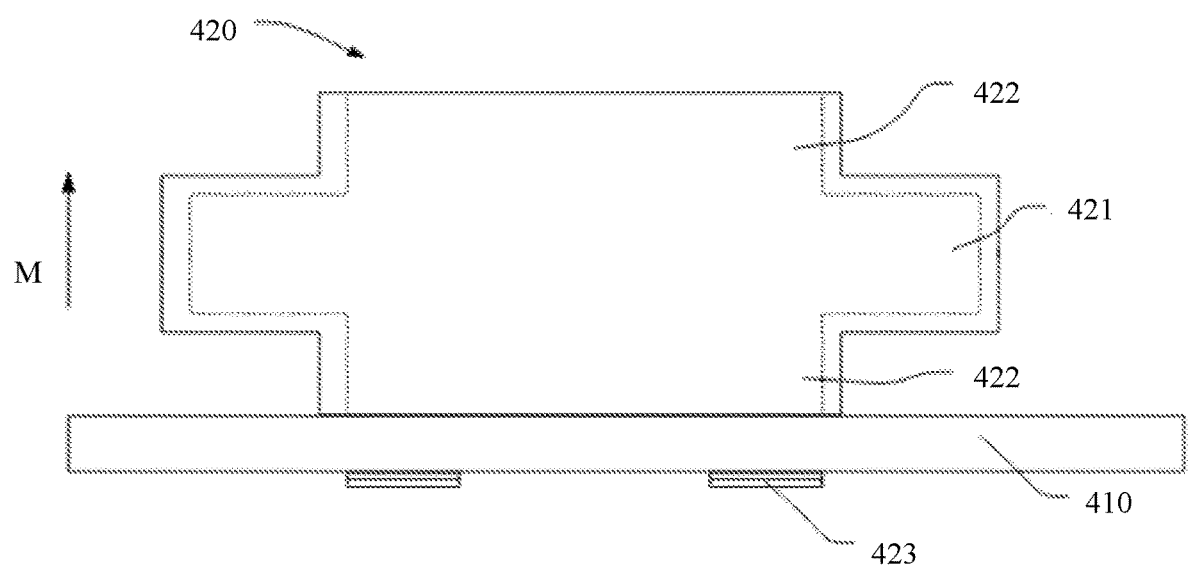
FIG. 12 is a schematic structural diagram of engagement between an expansion cavity muffler and a hard drive backplane according to an embodiment of this application.

411. FIG. 12 is a schematic structural diagram of engagement between an expansion cavity muffler and a hard drive backplane according to an embodiment of this application. As shown in FIG. 12, the expansion cavity muffler 420 is directly snap-fit to the ventilation hole 411 of the hard drive backplane 410 through the hook portion 423. In this solution, the mounting process is simple, and no fabrication process needs to be additional performed on the hard drive backplane 410 to adapt to the mounting of the expansion cavity muffler 420. This solution is efficient and facilitates reconstruction of an existing electronic device. Alternatively, the expansion cavity muffler 420 may be mounted on the hard drive backplane 410 by adhesion or screw connection. This is not limited in this application.

A material of the expansion cavity muffler 420 is not limited, for example, may be plastic or metal. The plastic used may be specifically general-purpose plastic, engineering plastic, special-purpose plastic, or the like. This is not limited in this application.

The expansion cavity muffler 420 may specifically be an integrally formed structure. For example, when the material of the expansion cavity muffler 420 is plastic, the expansion cavity muffler 420 may be prepared by an injection molding process. This process is simple. In addition, the integrally formed structure can further ensure tightness of the connection between the expansion cavity 421 and the connecting pipe 422 to prevent air leakage, thereby providing good noise reduction and ventilation effects.

A shape of the cross-section of the expansion cavity 421 perpendicular to the first direction M and a shape of the cross-section of the connecting pipe 422 perpendicular to the first direction M may be identical or different, and may be designed according to a requirement, for example, may be any shape such as a circle, a square, an oval, or a polygon. Specifically, the shape of the cross-section of the expansion cavity 421 perpendicular to the first direction M and the shape of the cross-section of the connecting pipe 422 perpendicular to the first direction M may be identical to a shape of the ventilation hole 411, so that ventilation cavities of different parts match each other, thereby reducing the wind resistance generated by the expansion cavity muffler 420.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A hard drive backplane assembly, comprising:
a hard drive backplane comprising a surface and a plurality of ventilation holes, and
an expansion cavity muffler disposed in communication with the ventilation holes and comprising:
at least one expansion cavity; and
at least one connecting pipe disposed in communication with the at least one expansion cavity in a first direction and comprising a first end that is facing toward the hard drive backplane and that is fixedly mounted in the ventilation holes,
wherein a first area of a cross-section that is of each expansion cavity and that is perpendicular to the first direction is larger than a second area of a cross-section that is of the at least one connecting pipe adjacent to the expansion cavity and that is perpendicular to the first direction, and
wherein the first direction is perpendicular to surface.

2. The hard drive backplane assembly of claim 1, wherein the expansion cavity muffler further comprises an expansion cavity having two ends and two connecting pipes respectively in communication with the two ends.

3. The hard drive backplane assembly of claim 1, wherein the expansion cavity muffler further comprises at least two expansion cavities, and wherein every adjacent two expansion cavities are in communication with each other through the at least one connecting pipe.

4. The hard drive backplane assembly of claim 1, wherein the at least one connecting pipe extends into adjacent expansion cavities by a specified distance.

5. The hard drive backplane assembly of claim 1, wherein the expansion cavity muffler further comprises a ventilation cavity, wherein a vertical projection of the ventilation cavity on the surface completely covers the ventilation holes.

6. The hard drive backplane assembly of claim 1, further comprising a sound-absorbing layer disposed on an inner surface or an outer surface of the expansion cavity muffler.

7. The hard drive backplane assembly of claim 1, wherein the expansion cavity muffler is coupled to the hard drive backplane by snap-fit, adhesion, or a screw.

8. The hard drive backplane assembly of claim 1, wherein the expansion cavity muffler is an integrally molded structure.

9. The hard drive backplane assembly of claim 1, wherein a first shape of the first cross-section and a second shape of the second cross-section are identical to a third shape of the ventilation holes.

10. The hard drive backplane assembly of claim 1, wherein the expansion cavity muffler comprises an expansion cavity and a connecting pipe in communication with the expansion cavity.

11. An electronic device, comprising:
a hard drive backplane assembly;
comprising:
a hard drive backplane comprising a surface and a plurality of ventilation holes; and
an expansion cavity muffler comprising:
at least one expansion cavity; and
at least one connecting pipe disposed in communication with the at least one expansion cavity in a first direction and comprising a first end that is facing towards the hard drive backplane and that is fixedly mounted in the ventilation hole,
wherein a first area of a first cross-section that is of each expansion cavity and that is perpendicular to the first direction is larger than a second area of a second cross-section that is of the at least one connecting pipe adjacent to the at least one expansion cavity and that is perpendicular to the first direction, and
wherein the first direction is perpendicular to the surface.

12. The electronic device of claim 11, wherein the expansion cavity muffler further comprises an expansion cavity having two ends and two connecting pipes respectively in communication with the two ends.

13. The electronic device of claim 11, wherein the expansion cavity muffler further comprises at least two expansion cavities, and wherein every adjacent two expansion cavities are in communication with each other through the at least one connecting pipe.

14. The electronic device of claim 11, wherein the at least one connecting pipe extends into adjacent expansion cavities by a specified distance.

15. The electronic device of claim 11, wherein the expansion cavity muffler further comprises a ventilation cavity, wherein a vertical projection of the ventilation cavity on the surface completely covers the ventilation hole.

16. The electronic device of claim 11, wherein the hard drive backplane assembly further comprises a sound-absorbing layer disposed on an inner surface or an outer surface of the expansion cavity muffler.

17. The electronic device of claim 11, wherein the expansion cavity muffler is coupled to the hard drive backplane by snap-fit, adhesion, or a screw.

18. The electronic device of claim 11, wherein the expansion cavity muffler is an integrally molded structure.

19. The electronic device of claim 11, wherein a first shape of the first cross-section and a second shape of the second cross-section are identical to a third shape of the ventilation holes.

20. The electronic device of claim 11, wherein the expansion cavity muffler further comprises an expansion cavity and a connecting pipe in communication with the expansion cavity.

* * * * *